US009972593B2

United States Patent

Huang et al.

(10) Patent No.: US 9,972,593 B2

(45) Date of Patent: May 15, 2018

(54) SEMICONDUCTOR PACKAGE

(71) Applicant: MediaTek Inc., Hsin-Chu (TW)

(72) Inventors: Ching-Liou Huang, Qionglin Township, Hsinchu County (TW); Ta-Jen Yu, Taichung (TW)

(73) Assignee: MediaTek Inc., Hsin-Chu (TW)

( * ) Notice: Subject to any disclaimer, the term of this patent is extended or adjusted under 35 U.S.C. 154(b) by 7 days.

(21) Appl. No.: 14/535,643

(22) Filed: Nov. 7, 2014

(65) Prior Publication Data

US 2016/0133594 A1 May 12, 2016

(51) Int. Cl.

*H01L 23/498* (2006.01)
*H01L 23/00* (2006.01)
*H01L 21/683* (2006.01)
*H01L 23/31* (2006.01)

(52) U.S. Cl.

CPC .......... *H01L 24/17* (2013.01); *H01L 21/6835* (2013.01); *H01L 23/49827* (2013.01); *H01L 24/16* (2013.01); *H01L 23/3128* (2013.01); *H01L 23/3192* (2013.01); *H01L 23/49811* (2013.01); *H01L 24/13* (2013.01); *H01L 2221/68345* (2013.01); *H01L 2224/0345* (2013.01); *H01L 2224/0346* (2013.01); *H01L 2224/0361* (2013.01); *H01L 2224/03912* (2013.01); *H01L 2224/05022* (2013.01); *H01L 2224/05166* (2013.01); *H01L 2224/05572* (2013.01); *H01L 2224/05647* (2013.01); *H01L 2224/1132* (2013.01); *H01L 2224/1147* (2013.01); *H01L 2224/11462* (2013.01); *H01L 2224/131* (2013.01); *H01L 2224/13012* (2013.01); *H01L 2224/13013* (2013.01); *H01L 2224/13014* (2013.01); *H01L 2224/13022* (2013.01); *H01L 2224/13083* (2013.01); *H01L 2224/13147* (2013.01);

(Continued)

(58) Field of Classification Search

CPC ......... H01L 23/5256; H01L 2924/3011; H01L 2224/16105; H01L 2224/16235; H01L 2224/17104

See application file for complete search history.

(56) References Cited

U.S. PATENT DOCUMENTS

2006/0186524 A1* 8/2006 Aiba .................. H01L 23/5384 257/686
2009/0289362 A1 11/2009 Rhyner et al.

(Continued)

FOREIGN PATENT DOCUMENTS

| JP | 20047024 | 1/2004 |
|---|---|---|
| TW | 200841431 | 10/2008 |
| TW | 201405728 | 2/2014 |

*Primary Examiner* — William F Kraig
*Assistant Examiner* — Khatib Rahman

(74) *Attorney, Agent, or Firm* — Wolf, Greenfield & Sacks, P.C.

(57) ABSTRACT

The invention provides a semiconductor package. The semiconductor package includes a base having a device-attach surface and a solder-ball attach surface opposite to the device-attach surface. A conductive via is disposed passing through the base. The conductive via includes a first terminal surface aligned to the device-attach surface of the base. A semiconductor die is mounted on the base by a conductive structure. The conductive structure is in contact with the first terminal surface of the conductive via.

32 Claims, 4 Drawing Sheets

(52) U.S. Cl.
CPC ............... *H01L 2224/13155* (2013.01); *H01L 2224/16105* (2013.01); *H01L 2224/16235* (2013.01); *H01L 2224/17104* (2013.01); *H01L 2224/26175* (2013.01); *H01L 2224/2919* (2013.01); *H01L 2224/32221* (2013.01); *H01L 2224/73204* (2013.01); *H01L 2224/81191* (2013.01); *H01L 2224/81385* (2013.01); *H01L 2224/83102* (2013.01); *H01L 2224/92125* (2013.01)

(56) References Cited

U.S. PATENT DOCUMENTS

2009/0321119 A1* 12/2009 Kohara ............. H01L 23/49822 174/260
2011/0101526 A1* 5/2011 Hsiao ................ H01L 23/49816 257/738
2011/0133327 A1* 6/2011 Hsu ....................... H01L 21/563 257/692
2012/0032314 A1 2/2012 Chen et al.
2012/0187545 A1* 7/2012 Khan .................... H01L 21/561 257/621
2012/0241955 A1* 9/2012 Law ........................ H01L 24/81 257/737
2012/0286416 A1 11/2012 Sato et al.
2013/0147052 A1* 6/2013 Zhang ..................... H01L 24/05 257/774
2013/0221536 A1* 8/2013 Gregorich ............... H01L 24/13 257/774
2014/0153210 A1 6/2014 Uzoh
2014/0191396 A1* 7/2014 Lin ......................... H01L 28/00 257/737

* cited by examiner

SEMICONDUCTOR PACKAGE

BACKGROUND OF THE INVENTION

Field of the Invention

The present invention relates to a semiconductor package, and in particular relates to a base design for a high-density semiconductor package.

Description of the Related Art

For a semiconductor chip package design, an increased number of input/output (I/O) connections for multi-functional chips is required. The impact of this will be pressure on printed circuit board (PCB) fabricators to minimize linewidth and space or to develop direct chip attach (DCA) semiconductors. However, the increased number of input/output connections of a multi-functional chip package may induce thermal electrical problems, for such as, problems with heat dissipation, cross talk, signal propagation delay, electromagnetic interference in RF circuits, etc. The thermal electrical problems may affect the reliability and quality of products.

Thus, a novel semiconductor package is desirable.

BRIEF SUMMARY OF THE INVENTION

A semiconductor package is provided. An exemplary embodiment of a semiconductor package includes a base having a device-attach surface and a solder-ball attach surface opposite to the device-attach surface. A conductive via passes through the base. A semiconductor die is mounted on the base by a conductive structure. The conductive structure is in contact with the first terminal surface of the conductive via.

Another exemplary embodiment of a semiconductor package includes a base having a device-attach surface. A conductive via passes through the base. A semiconductor die is mounted on the base. The semiconductor die is in contact with the conductive structure by a conductive structure.

Yet another exemplary embodiment of a semiconductor package includes a conductive via passes through a base. The conductive via has a first terminal surface and a second terminal surface opposite to the first terminal surface. A semiconductor die is in contact with a first terminal surface of the conductive via by a conductive structure. A solder-ball is in contact with a second terminal surface of the conductive via. The second terminal surface is opposite to the first terminal surface.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
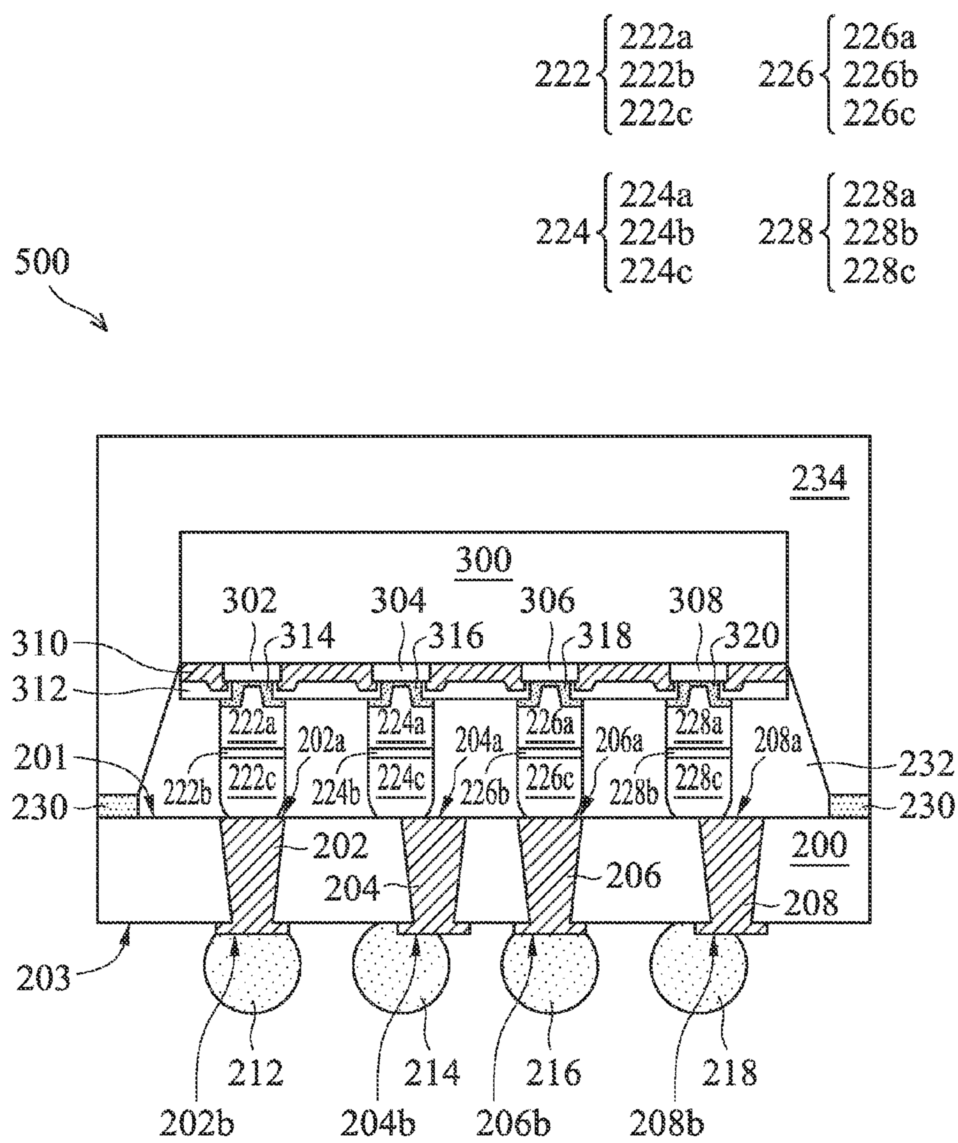
FIG. 1 is a cross-sectional view of a semiconductor package in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a cross-sectional view of a semiconductor package 500 in accordance with some embodiments of the disclosure. In some embodiments, the semiconductor package 500 can be a flip chip package using conductive structures, for example, copper pillar bumps, connecting a semiconductor device to a base. As illustrated in FIG. 1, the semiconductor package 500 includes a base 200, a semiconductor die 300 and conductive structures 222, 224, 226 and 228 in accordance with some embodiments of the disclosure.

In some embodiments as shown in FIG. 1, the base 200 includes a device-attach surface 201 and a solder-ball attach surface 203 opposite to the device-attach surface 201. In some embodiments, the base 200, for example a printed circuit board (PCB), may be a substrate which formed of polypropylene (PP). In some embodiments, a plurality of conductive vias 202, 204, 206 and 208 is disposed passing through the base 200. As shown in FIG. 1, the conductive via 202 includes a first terminal surface **202*a* and a second terminal surface 202*b* opposite to the first terminal surface 202*a*** in accordance with some embodiments of the disclosure.

In some embodiments, the first terminal surface **202*a* of the conductive via 202 may be aligned to the device-attach surface 201 of the base 200. In some embodiments, the second terminal surface 202*b* of the conductive via 202 is not coplanar with the device-attach surface 201 of the base 200. Similarly, the first terminal surfaces 204*a*, 206*a* and 208*a* of the conductive vias 204, 206 and 208 are designed to be aligned to the device-attach surface 201 of the base 200, respectively. Second terminal surfaces 204*b*, 206*b* and 208*b* of the conductive vias 204, 206 and 208 are not coplanar with the device-attach surface 201 of the base 200. In some other embodiments, additional metal films may be plated on the first terminal surface 202*a*, 204*a*, 206*a* and 208*a* of the conductive via 202, 204, 206 and 208, respectively. The additional metal films may serve as extruding portions of the conductive via 202, 204, 206 and 208. Therefore, the first terminal surface 202*a*, 204*a*, 206*a* and 208*a* of the conductive via 202, 204, 206 and 208 may extrude from the device-attach surface 201 of the base 200**.

Figure 2:
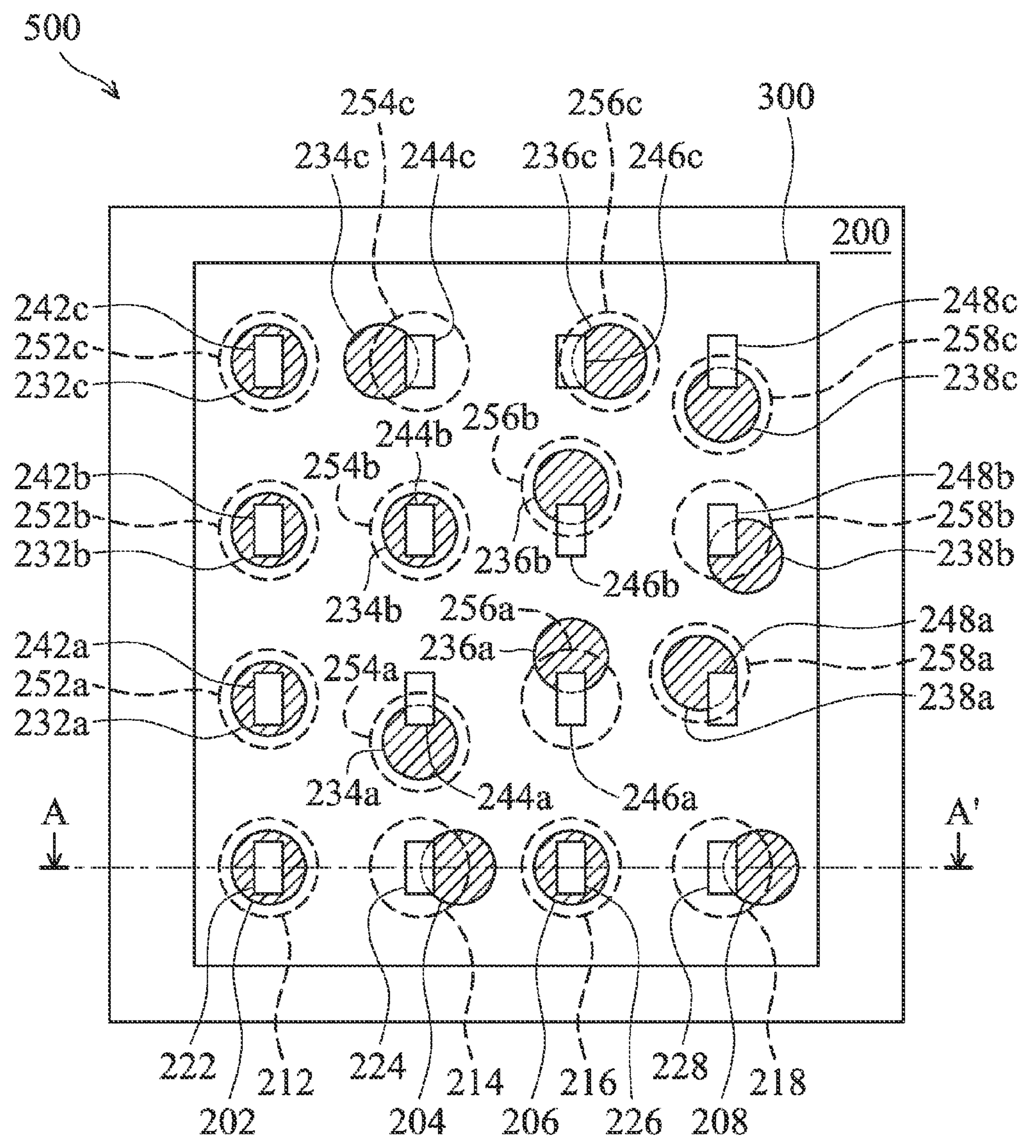
FIG. 2 is a plan view of a semiconductor die of a semiconductor package, showing the relationship between the conductive structures of the semiconductor die and the conductive vias of the base of the semiconductor package, in accordance with some embodiments of the disclosure.
Figure 3A:
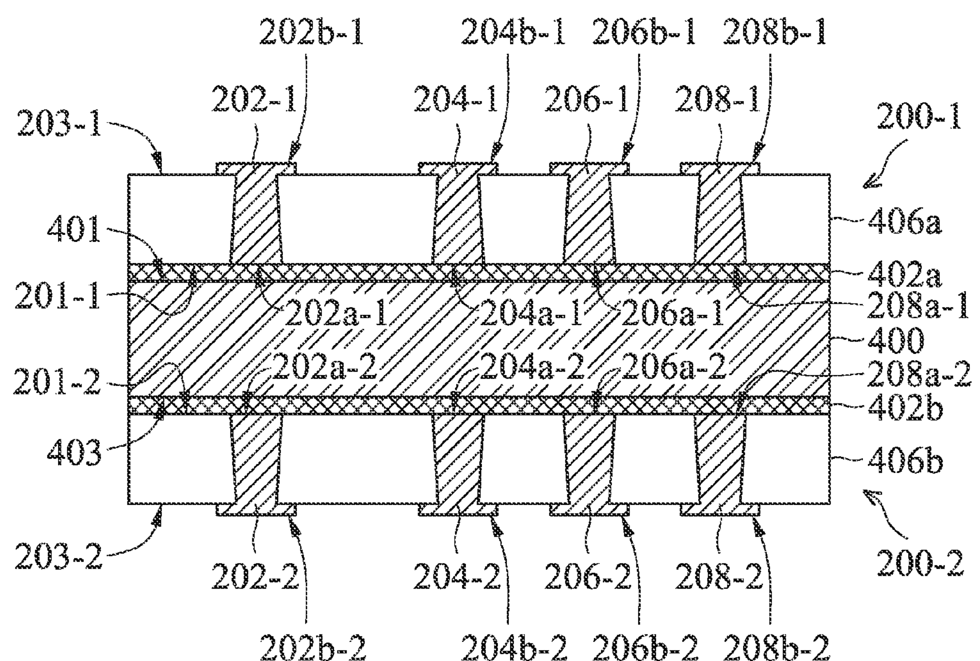
FIGS. 3A and 3B are cross sections showing one exemplary embodiment of a method for fabricating a base for a semiconductor package of the invention.
Figure 3B:
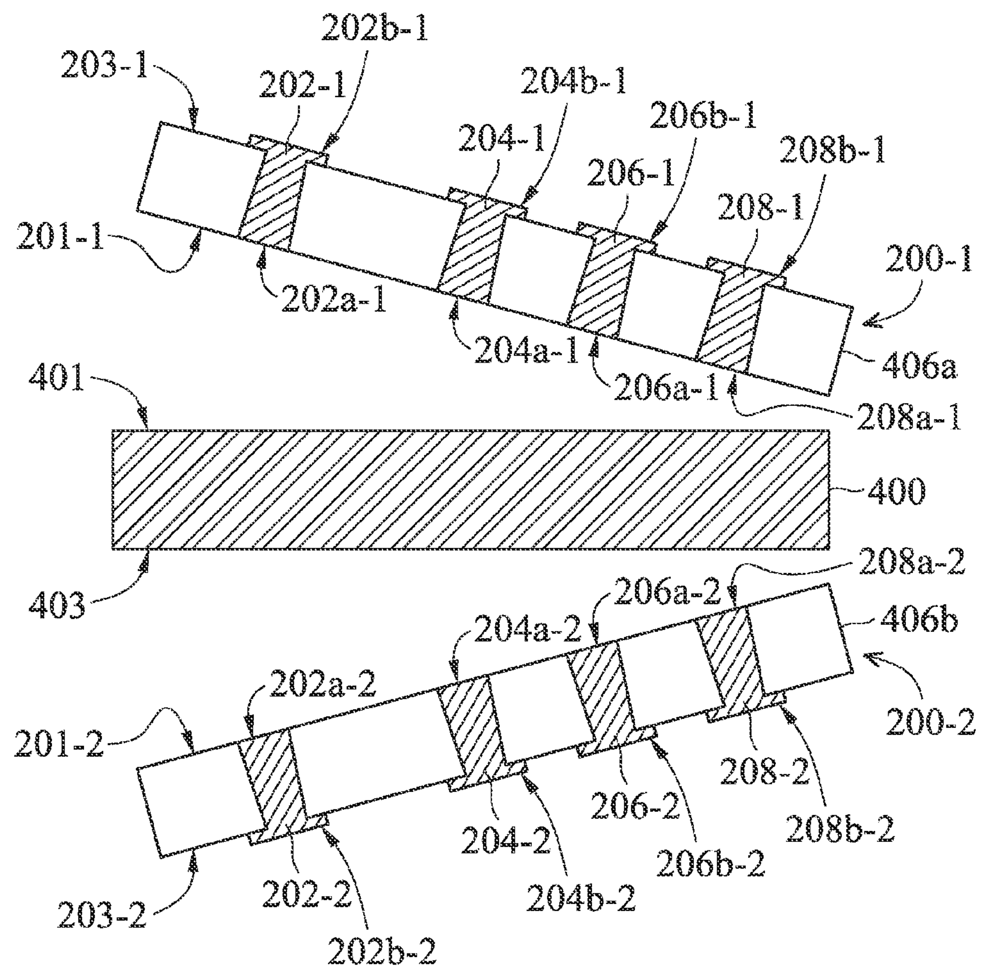

FIGS. 3A and 3B are cross sections showing one exemplary embodiment of a method for fabricating the base 200 (including base 200-1 and 200-2) for the semiconductor package 500 of the invention. FIGS. 3A and 3B also illustrate how the first terminal surface of the conductive via can be aligned to the device-attach surface of the base. In some embodiments, the method for fabricating bases for the semiconductor package 500 is also called a double-sided base fabricating process. Elements of the embodiments that are the same or similar as those previously described with reference to FIGS. 1-2, are not repeated hereinafter for brevity. As shown in FIG. 3A, a carrier 400 with conductive seed layers 402*a* and 402*b* on the top surface 401 and the bottom surface 403 is provided. In some embodiments, the carrier 400 may comprise FR4 glass epoxy or stainless steel. Also, the conductive seed layers 402*a* and 402*b* are used as seed layers for subsequently formed conductive vias of bases. In some embodiments, the conductive seed layers 402*a* and 402*b* may comprise copper.

Next, as shown in FIG. 3A, a laminating process is performed to respectively dispose a base material layer 406*a* and a base material layer 406*b* on the top surface 401 and the bottom surface 403 of the carrier 400, wherein the base material layer 406*a* and a base material layer 406*b* respectively cover the first conductive traces 404*a* and 404*b*. In some embodiments, the laminating process of the base material layer 406*a* and the base material layer 406*b* is simultaneously performed on the top surface 401 and the bottom surface 403 of the carrier 400. In some embodiments, the base material layer 406*a* and the base material layer 406*b* may include polypropylene (PP). In some embodiments, the base material layer 406*a* includes a device-attach surface 201-1 and a solder-ball attach surface 203-1. Similarly, the base material layer 406*b* includes a device-attach surface 201-2 and a solder-ball attach surface 203-2. As shown in FIG. 3A, the device-attach surfaces 201-1 and 201-2 are in contact with the conductive seed layers 402*a* and 402*b*, respectively. The solder-ball attach surfaces 203-1 and 203-2 are respectively opposite to the device-attach surfaces 201-1 and 201-2. In some embodiments, the solder-ball attach surfaces 203-1 and 203-2 are away from the conductive seed layers 402*a* and 402*b*, respectively.

Next, please refer to FIG. 3A again, wherein a drilling process is performed to form openings (not shown) through the base material layer 406*a* and the base material layer 406*b* to define the positions of subsequently formed conductive vias 202-1, 202-2, 204-1, 204-2 206-1, 206-2, 208-1 and 208-2. In some embodiments, the drilling process may comprise a laser drilling process, an etching drilling process or a mechanical drilling process. Next, a plating process and an anisotropic etching process is performed to fill a conductive material into the openings to form the conductive vias 202-1, 204-1, 206-1, 208-1 through the base material layer 406*a*, and to form the conductive vias 202-2, 204-2, 206-2 and 208-2 through the base material layer 406*b*. In some embodiments, the drilling process, the plating process and the anisotropic etching process are simultaneously performed on the base material layer 406*a* and the base material layer 406*b*. In some embodiments, the plating process may comprise an electrical plating process.

As shown in FIG. 3A, the conductive vias 202-1, 204-1, 206-1, 208-1 respectively have first terminal surfaces 202*a*-1, 204*a*-1, 206*a*-1 and 208*a*-1 and second terminal surfaces 202*b*-1, 204*b*-1, 206*b*-1 and 208*b*-1. The second terminal surfaces 202*b*-1, 204*b*-1, 206*b*-1 and 208*b*-1 are respectively opposite to the first terminal surfaces 202*a*-1, 204*a*-1, 206*a*-1 and 208*a*-1. Similarly, the conductive vias 202-2, 204-2, 206-2, 208-2 respectively have first terminal surfaces 202*a*-2, 204*a*-2, 206*a*-2 and 208*a*-2, and second terminal surfaces 202*b*-2, 204*b*-2, 206*b*-2 and 208*b*-2. The second terminal surfaces 202*b*-2, 204*b*-2, 206*b*-2 and 208*b*-2 are respectively opposite to the first terminal surfaces 202*a*-2, 204*a*-2, 206*a*-2 and 208*a*-2.

As shown in FIG. 3A, the device-attach surface 201-1 of the base material layer 406*a* and the device-attach surface 201-2 of the base material layer 406 are in contact with the conductive seed layers 402*a* and 402*b*, respectively. Therefore, the first terminal surfaces 202*a*-1, 204*a*-1, 206*a*-1 and 208*a*-1 of the conductive vias 202-1, 204-1, 206-1, 208-1 are aligned to the device-attach surface 201-1 of the base material layer 406*a* after performing the plating process and anisotropic etching process. The second terminal surfaces 202*b*-1, 204*b*-1, 206*b*-1 and 208*b*-1 are not required to be coplanar with the solder-ball attach surface 203-1 of the base material layer 406*a*. Similarly, the first terminal surfaces 202*a*-2, 204*a*-2, 206*a*-2 and 208*a*-2 of the conductive vias 202-2, 204-2, 206-2, 208-2 are aligned to the device-attach surface 201-2 of the base material layer 406*b*. The second terminal surfaces 202*b*-2, 204*b*-2, 206*b*-2 and 208*b*-2 are not required to be coplanar with the solder-ball attach surface 203-2 of the base material layer 406*a*.

Next, as shown in FIG. 3B, the base material layer 406*a* and the base material layer 406*b* are respectively separated from the top surface 401 and the bottom surface 403 of the carrier 400 to form bases 200-1 and 200-2, which are separated from each other. Next, as shown in FIG. 3B, again, the conductive seed layers 402*a* and 402*b* are removed from the bases 200-1 and 200-2, respectively.

Please return to FIG. 1, because the first terminal surfaces 202*a*, 204*a*, 206*a* and 208*a* of the conductive vias 202, 204, 206, 208 are designed to be aligned to the device-attach surface 201 of the base 200. The first terminal surfaces 202*a*, 204*a*, 206*a* and 208*a* of the conductive vias 202, 204, 206, 208 can be provided the conductive structures 222, 224, 226 and 228, for example, copper pillar bumps, directly disposed thereon. In some embodiments, the second terminal surfaces 202*b*, 204*b*, 206*b* and 208*b* of the conductive vias 202, 204, 206 and 208 are provided solder balls 212, 214, 216 and 218 disposed thereon, respectively.

As shown in FIG. 1, the semiconductor die 300 is mounted on the die attach surface 201 of the base 200 by the conductive structures 222, 224, 226 and 228 in accordance with some embodiments of the disclosure. In some embodiments, an active surface of the semiconductor die 300 faces the base 200 by a bonding process. Circuits of the semiconductor die 300 are disposed on the active surface. In some embodiments, pads 302, 304, 306, 308 are disposed on the top of the circuitry of the semiconductor die 300. In some embodiments, the pads 302, 304, 306, 308 belong to the uppermost metal layer of the interconnection structure (not shown) of the semiconductor die 300. In some embodiments, the pads 302, 304, 306, 308 are arranged in the central area of the semiconductor die 300 to be used to transmit ground or power signals of the semiconductor die 300. Also, for the clear illustration of the relationship between the conductive structures 222, 224, 226 and 228 used for power or ground pads 302, 304, 306, 308 of the semiconductor die 300 and the conductive vias 202, 204, 206, 208 of the base 200, the conductive structures used for signal pads of the semiconductor dies are not shown in the figures (FIGS. 1 and 2).

As shown in FIG. 1, a first passivation layer 310 is conformably formed covering the pads 302, 304, 306, 308 of the semiconductor die 300, in accordance with some embodiments of the disclosure. In some embodiments, the first passivation layer 310 is formed by deposition and patterning processes. In some embodiments, the first passivation layer 310 may be formed of materials including oxide, nitride, or oxynitride. In some embodiments, the first passivation layer 310 has openings on the pads 302, 304,

306, 308 of the semiconductor die 300, so that a portion of the pads 302, 304, 306, 308 are respectively exposed from the openings.

In some embodiments, a second passivation layer 312 with openings therethrough is formed on the first passivation layer 310, as shown in FIG. 1. In some embodiments, the second passivation layer 312 is formed by a coating patterning and curing process. In some embodiments, the second passivation layer 312 may comprise polyimide for providing reliable insulation when the semiconductor die 300 is subjected to various types of environmental stresses. A portion of each of the pads 302, 304, 306, 308 of the semiconductor die 300 is respectively exposed from the openings of the second passivation layer 312.

In some embodiments, the semiconductor package 500 uses the conductive structures 222, 224, 226 and 228 respectively connecting the power and ground pads of the semiconductor die 300 to the base 200 as shown in FIG. 1 (the conductive structures used for the signal pad of the semiconductor die are not shown in FIG. 1). In some embodiments, each of the conductive structures may be a copper pillar bump structure composed of a metal stack comprising a UBM (under bump metallurgy) layer, a conductive pillar, a conductive buffer layer, and a solder cap. In some embodiments, the conductive structures 222, 224, 226 and 228 are bump on trace (BOT) structures and rectangular in a plan view as shown in FIG. 2. In some other embodiments, the conductive structures 222, 224, 226 and 228 can be designed to have other 180-degree rotationally symmetrical shapes, for example, an oval-shape or an octagonal shape.

As shown in FIG. 1, under bump metallurgy (UBM) layer patterns 314, 316, 318 and 320 of the conductive structure 222, 224, 226 and 228 are formed on the second passivation layer 312, which is disposed on the semiconductor die 300, in accordance with some embodiments of the disclosure. In some embodiments, the UBM layer patterns 314, 316, 318 and 320 are formed by a deposition method such as a sputtering or plating method and a subsequent anisotropic etching process. The anisotropic etching process is performed after forming conductive pillars. In some embodiments, the UBM layer patterns 314, 316, 318 and 320 line sidewalls and bottom surfaces of the openings of the second passivation layer 312. Also, the UBM layer patterns 314, 316, 318 and 320 extend over the top surface of the second passivation layer 312. In one embodiment, the UBM layer patterns 314, 316, 318 and 320 are composed of a Ti layer and a Cu layer on the Ti layer.

As shown in FIG. 1, conductive pillars **222*a*, 224*a*, 226*a* and 228*a* are respectively formed on the UBM layer patterns 314, 316, 318 and 320, in accordance with some embodiments of the disclosure. The conductive pillars 222*a*, 224*a*, 226*a* and 228*a* are separated from each other. In some embodiments, the conductive pillars 222*a*, 224*a*, 226*a* and 228*a* respectively fill the openings of the second passivation layer 312 disposed on the semiconductor die 300. It should be noted that the conductive pillar and the UBM layer patterns within the same opening may form an integral plug of the resulting conductive structure. Formation positions of the conductive pillars 222*a*, 224*a*, 226*a* and 228*a* are defined by a dry film photoresist or liquid photoresist patterns (not shown). In some embodiments, the conductive pillars 222*a*, 224*a*, 226*a* and 228*a* are used as solder joints for subsequent conductive structures, which are used to transmit ground or power signals of the semiconductor die 300, disposed thereon. Therefore, the conductive pillars 222*a*, 224*a*, 226*a* and 228*a* may help to increase the mechanical strength of the bump structure. In some embodiments, the conductive pillars 222*a*, 224*a*, 226*a* and 228*a*** may be formed of copper, so that deformation may be prevented during a subsequent solder re-flow process.

As shown in FIG. 1, conductive buffer layers **222*b*, 224*b*, 226*b* and 228*b* are respectively formed on the corresponding conductive pillars 222*a*, 224*a*, 226*a* and 228*a*, in accordance with some embodiments of the disclosure. In some embodiments, the conductive buffer layers 222*b*, 224*b*, 226*b* and 228*b* are formed by an electroplating method. In some embodiments, the conductive buffer layers 222*b*, 224*b*, 226*b* and 228*b* are optional elements serving as a seed layer, an adhesion layer and a barrier layer for subsequent conductive bumps formed thereon. In some embodiments, the conductive buffer layers 222*b*, 224*b*, 226*b* and 228*b* may comprise Ni. In some embodiments, the number of conductive buffer layers corresponds to the number of conductive pillars designed on the semiconductor die 300**.

As shown in FIG. 1, solder caps **222*c*, 224*c*, 226*c* and 228*c* are respectively formed on the corresponding conductive buffer layers 222*b*, 224*b*, 226*b* and 228*b*, in accordance with some embodiments of the disclosure. In some embodiments, the solder caps 222*c*, 224*c*, 226*c* and 228*c* are formed by electroplating a solder material with a patterned photoresist layer or by a screen printing process and a subsequent solder re-flow process. As shown in FIG. 1, the UBM layer pattern 314, the conductive pillar 222*a*, the conductive buffer layers 222*b* (optional element), and solder cap 222*c* collectively form the conductive structure 222. The UBM layer pattern 316, the conductive pillar 224*a*, the conductive buffer layers 224*b* (optional element), and solder cap 224*c* collectively form the conductive structure 224. The UBM layer pattern 318, the conductive pillar 226*a*, the conductive buffer layers 226*b* (optional element), and solder cap 226*c* collectively form the conductive structure 226. The UBM layer pattern 320, the conductive pillar 228*a*, the conductive buffer layers 228*b* (optional element), and solder cap 228*c* collectively form the conductive structure 228**.

In some embodiments, a solder resistance layer 230 is disposed on the base 200, away from an overlap region between the semiconductor die 300 and the base 200 as shown in FIG. 1. In some embodiments, the solder resistance layer 230 is formed by electroplating with a patterned photoresist layer or by a screen printing process.

In some embodiments, an underfill material or the underfill 232 can be introduced into the gap between the semiconductor die 300 and the base 200 as shown in FIG. 1. The underfill 232 covers the conductive structures 224-228 and is adjacent to the solder resistance layer 230. In some embodiments, the underfill 232 may comprise a capillary underfill (CUF), molded underfill (MUF) or a combination thereof.

As shown in FIG. 1, a molding compound 234 is formed covering the semiconductor die 300, the solder resistance layer 230, the underfill 232 and the device-attach surface 201 of the base 200 close to the semiconductor die 300. In some embodiments, the molding compound 234 may be formed of molding materials such as resin.

FIG. 2 is a plan view of the semiconductor die 300 of the semiconductor package 500, in accordance with some embodiments of the disclosure. Also, FIG. 2 shows the relationship between the conductive structures and the conductive vias of the base of the semiconductor package, in accordance with some embodiments of the disclosure. FIG. 1 is also a cross-sectional view taken along line A-A' of FIG. 2. It should be noted that for the clear illustration of the relationship between the conductive structures used for power or ground pads of the semiconductor die and the conductive vias of the base of the semiconductor package, the conductive structures and the conductive vias corresponding to the signal pads of the semiconductor die are not shown in FIG. 2. Also, the solder resistance layer, the underfill and the molding compound of the semiconductor package 500 are not shown in FIG. 2.

As shown in FIGS. 1 and 2, the first terminal surfaces 202*a*, 204*a*, 206*a* and 208*a* of the conductive vias 202, 204, 206, 208 are designed to be aligned to the device-attach surface 201 of the base 200 according to the fabrication process, in accordance with some embodiments of the disclosure. The first terminal surfaces 202*a*, 204*a*, 206*a* and 208*a* of the conductive vias 202, 204, 206, 208 can be provided the conductive structures 222, 224, 226 and 228, for example, copper pillar bumps, directly disposed thereon. Therefore, the first terminal surfaces 202*a*, 204*a*, 206*a* and 208*a* of the conductive vias 202, 204, 206, 208 also serve as interfaces between the conductive structures 222, 224, 226 and 228 and the conductive vias 202, 204, 206, 208, respectively. In some embodiments, the second terminal surfaces 202*b*, 204*b*, 206*b* and 208*b* of the conductive vias 202, 204, 206 and 208 are provided solder balls 212, 214, 216 and 218 directly disposed thereon, respectively. Therefore, the second terminal surfaces 202*b*, 204*b*, 206*b* and 208*b* of the conductive vias 202*a*, 204*a*, 206*a* and 208*a* may also serve as interfaces between the conductive vias 202, 204, 206, 208 and the solder balls 212, 214, 216 and 218.

In some embodiments, the conductive vias of the base 200 are defined as extending only along a direction substantially vertical to the device-attach surface 201 and the solder-ball attach surface 203 of the base 200 as shown in FIGS. 1 and 2. The terminal surfaces of the conductive vias, which are close to the device-attach surface 201 of the base 200, do not have any redistribution routing function. That is to say, the conductive via plugs of the base 200 do not have any segments extending substantially along the device-attach surface 201 of the base 200. In some embodiments, no conductive pad is disposed on the base, covering the terminal surface of the conductive via, which is close to the device-attach surface 201 of the base 200. That is to say, there is no conductive pad disposed between the conductive structure and the conductive via passing through the base 200. In some embodiments, the first terminal surfaces 202*a*, 204*a*, 206*a* and 208*a* respectively fully overlap with the second terminal surfaces 202*b*, 204*b*, 206*b* and 208*b* of the conductive vias 202, 204, 206 and 208 in a cross-sectional view as shown in FIG. 1 and in a plan view as shown in FIG. 2. Similarly, first terminal surfaces of the conductive vias 232*a*-232*c*, 234*a*-234*c*, 236*a*-236*c* and 238*a*-238*c*, which are provided conductive structures 242*a*-242*c*, 244*a*-244*c*, 246*a*-246*c* and 248*a*-248*c* directly disposed thereon, are designed to fully overlap with second terminal surfaces of the conductive vias 232*a*-232*c*, 254*a*-234*c*, 236*a*-236*c* and 238*a*-238*c*, which are provided the solder balls 252*a*-252*c*, 254*a*-254*c*, 256*a*-256*c* and 258*a*-258*c* disposed thereon, respectively, in accordance with some embodiments of the disclosure as shown in FIG. 2.

In some embodiments, the conductive structures of the semiconductor package 500 can be designed to fully or partially overlap with the corresponding conductive vias of the base 200 in a cross-sectional view as shown in FIG. 1 and in a plan view as shown in FIG. 2. The arrangement of the conductive structures is not limited by the positions of the corresponding conductive vias of the base. For example, the conductive structures are not required to be disposed spaced apart from the corresponding conductive vias of the base. Therefore, the input/output (I/O) connection counts of the semiconductor die 300 and the conductive via counts of the base 200 can be improved, a high-density semiconductor package is achieved. For example, the conductive structures 222, 226, 242*a*, 242*b*, 242*c*, 244*b* are designed to fully overlap with the corresponding conductive vias 202, 206, 232*a*, 232*b*, 232*c*, 234*b* of the base 200 as shown in FIGS. 1 and 2. For example, the conductive structures 224, 228, 244*a*, 244*c*, 246*a*-246*c*, 248*a*-248*c* are designed to partially overlap with the corresponding conductive vias 204, 208, 234*a*, 234*c*, 236*a*-236*c*, 238*a*-238*c* of the base 200 as shown in FIGS. 1 and 2.

In some embodiments, the conductive vias of the base 200 are designed to fully overlap with the corresponding solder balls on the base 200 in a cross-sectional view as shown in FIG. 1 and in a plan view as shown in FIG. 2. Therefore, the conductive structures of the semiconductor package 500 can be designed to fully overlap or partially overlap the corresponding solder balls, in accordance with some embodiments of the disclosure as shown in FIGS. 1 and 2. For example, the conductive structures 222, 226, 242*a*, 242*b*, 242*c*, 244*b* are designed to fully overlap with the corresponding solder balls 212, 216, 252*a*, 252*b*, 252*c*, 254*b* on the base 200 as shown in FIGS. 1 and 2. For example, the conductive structures 224, 228, 244*a*, 244*c*, 246*a*-246*c*, 248*a*-248*c* are designed to partially overlap with the corresponding conductive vias 214, 218, 254*a*, 254*c*, 256*a*-256*c*, 258*a*-258*c* on the base 200 as shown in FIGS. 1 and 2.

Embodiments provide a semiconductor package. The semiconductor die of the semiconductor package connects to the base using conductive structures, which is in contact with the corresponding conductive vias passing through the base. The conductive structures are designed to connect to power or ground pads of the semiconductor die. According to the design of the base, the interface between the conductive structure and the corresponding conductive via is aligned to the device-attach surface of the base. The conductive structure can be designed to be in contact with the corresponding conductive via without any conductive pad or redistribution pattern. The arrangement of the conductive structures is not limited by the positions of the corresponding conductive vias of the base. The input/output (I/O) connection counts of the semiconductor die and the conductive via counts of the base can be improved, and a high-density semiconductor package is achieved. Also, the semiconductor package may have improved the voltage drop across the network in the package. Also, the heat generated from the semiconductor die can be quickly dissipated to the outside due to the shortened path (The conductive structure can be design to be in contact with the corresponding conductive via without any conductive pad or redistribution pattern). The thermal performance of the semiconductor package can be improved.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package, comprising:

a base having a device-attach surface and a solder-ball attach surface opposite to the device-attach surface;

a conductive via passing through the base; and a semiconductor die mounted on the base by a conductive structure having opposing sides extending between the base and the semiconductor die, wherein the conductive structure is in direct contact with a first terminal surface of the conductive via, and wherein the conductive structure partially overlaps with the conductive via such that, in plan view, a first of the sides is positioned outside a periphery of the first terminal surface of the conductive via and a second of the sides is positioned within the periphery, wherein the conductive structure comprises a conductive pillar and a conductive solder cap, the conductive pillar and the conductive solder cap define corresponding portions of each of the first of the sides and the second of the sides, and the conductive solder cap is in direct physical contact with the first terminal surface of the conductive via.

2. The semiconductor package as claimed in claim 1, wherein the first terminal surface of the conductive via is aligned to the device-attach surface, and the conductive via comprises a second terminal surface opposite to the first terminal surface, wherein the second terminal surface is away from the semiconductor die.

3. The semiconductor package as claimed in claim 2, wherein the second terminal surface of the conductive via is not coplanar with the solder-ball attach surface of the base.

4. The semiconductor package as claimed in claim 2, further comprising:

a solder-ball disposed on the solder-ball attach surface of the base and in contact with the second terminal surface of the conductive via.

5. The semiconductor package as claimed in claim 4, wherein the solder-ball overlaps with the conductive structure.

6. The semiconductor package as claimed in claim 4, wherein the solder-ball fully overlaps with the conductive via.

7. The semiconductor package as claimed in claim 1, wherein the conductive structure is coupled to a power pad or ground pad of the semiconductor die.

8. The semiconductor package as claimed in claim 1, wherein the conductive structure is a bump on trace structure and rectangular in a plan view.

9. A semiconductor package, comprising:

a base having a device-attach surface;

a conductive via passing through the base; and a semiconductor die mounted on the base, wherein the semiconductor die is in contact with the conductive via by a conductive structure having opposing sides extending between the base and the semiconductor die, and the conductive structure is in direct contact with a first terminal surface of the conductive via, and wherein the conductive structure partially overlaps with the conductive via such that, in plan view, a first of the sides is positioned outside a periphery of the first terminal surface of the conductive via and a second of the sides is positioned within the periphery, wherein the conductive structure comprises a conductive pillar and a conductive solder cap, the conductive pillar and the conductive solder cap define corresponding portions of each of the first of the sides and the second of the sides, and the conductive solder cap is in direct physical contact with the first terminal surface of the conductive via.

10. The semiconductor package as claimed in claim 9, wherein the base has a solder-ball attach surface opposite to the device-attach surface, wherein the solder-ball attach surface is away from the semiconductor die.

11. The semiconductor package as claimed in claim 10, further comprising:

a solder-ball disposed on the solder-ball attach surface of the base and in contact with the conductive via, wherein a second interface between the conductive via and the solder-ball is opposite to a first interface between the conductive structure and the conductive via.

12. The semiconductor package as claimed in claim 11, wherein the first interface between the conductive structure and the conductive via is aligned to the device-attach surface of the base, and the second interface between the conductive via and the solder-ball is opposite to the first interface, wherein the second interface is not coplanar with the solder-ball attach surface of the base.

13. The semiconductor package as claimed in claim 11, wherein the solder-ball fully overlaps with the conductive structure.

14. The semiconductor package as claimed in claim 9, wherein the solder-ball partially overlaps with the conductive structure.

15. The semiconductor package as claimed in claim 9, wherein the conductive structure is a bump on trace structure and rectangular in a plan view.

16. A semiconductor package, comprising:

a conductive via passing through a base, having a first terminal surface and a second terminal surface opposite to the first terminal surface;

a semiconductor die in contact with the first terminal surface of the conductive via by a conductive structure having opposing sides extending between the base and the semiconductor die, wherein the conductive structure is in direct contact with the first terminal surface of the conductive via, and wherein the conductive structure partially overlaps with the conductive via such that, in plan view, a first of the sides is positioned outside a periphery of the first terminal surface of the conductive via and a second of the sides is positioned within the periphery; and a solder-ball in contact with the second terminal surface of the conductive via, wherein the conductive structure comprises a conductive pillar and a conductive solder cap, the conductive pillar and the conductive solder cap define corresponding portions of each of the first of the sides and the second of the sides, and the conductive solder cap is in direct physical contact with the first terminal surface of the conductive via.

17. The semiconductor package as claimed in claim 16, wherein a surface of the base is a device-attach surface.

18. The semiconductor package as claimed in claim 17, wherein the second terminal surface of the conductive via is close to a solder-ball attach surface opposite to the device-attach surface of the base.

19. The semiconductor package as claimed in claim 18, wherein the first terminal surface is aligned to the surface of the base, and the second terminal surface of the conductive via is not coplanar with the solder-ball attach surface of the base.

20. The semiconductor package as claimed in claim 16, wherein the solder-ball fully overlaps with the conductive structure.

21. The semiconductor package as claimed in claim 16, wherein the solder-ball partially overlaps with the conductive structure.

22. The semiconductor package as claimed in claim 16, wherein the conductive structure is a bump on trace structure and rectangular in a plan view.

23. The semiconductor package as claimed in claim 1, wherein the conductive structure further comprises a conductive buffer layer disposed between the conductive pillar and the conductive solder cap.

24. The semiconductor package as claimed in claim 1, wherein the conductive structure further comprises a conductive buffer layer disposed between the conductive pillar and the conductive solder cap.

25. The semiconductor package as claimed in claim 1, wherein the conductive structure further comprises a conductive buffer layer disposed between the conductive pillar and the conductive solder cap.

26. The semiconductor package as claimed in claim 1, wherein the conductive structure further comprises an under bump metallurgy layer disposed between the conductive pillar and the semiconductor die.

27. The semiconductor package as claimed in claim 9, wherein the conductive structure further comprises an under bump metallurgy layer disposed between the conductive pillar and the semiconductor die.

28. The semiconductor package as claimed in claim 16, wherein the conductive structure further comprises an under bump metallurgy layer disposed between the conductive pillar and the semiconductor die.

29. The semiconductor package as claimed in claim 1, wherein the conductive solder cap is in direct physical contact with the device-attach surface of the base outside the periphery of the conductive via.

30. The semiconductor package as claimed in claim 9, wherein the conductive solder cap is in direct physical contact with the device-attach surface of the base outside the periphery of the conductive via.

31. The semiconductor package as claimed in claim 16, wherein the conductive solder cap is in direct physical contact with the device-attach surface of the base outside the periphery of the conductive via.

32. The semiconductor package as claimed in claim 4, wherein the solder-ball partially overlaps with the conductive via.

* * * * *